United States Patent
Li et al.

(10) Patent No.: US 7,248,610 B2
(45) Date of Patent: Jul. 24, 2007

(54) DUAL LOOP AUTOMATIC POWER CONTROL FOR LASER DRIVER

(75) Inventors: Day-Uei Li, Hsinchu (TW); Li-Ren Huang, Taipei (TW); Wei-Zen Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 263 days.

(21) Appl. No.: 11/119,832

(22) Filed: May 3, 2005

(65) Prior Publication Data
US 2006/0120420 A1    Jun. 8, 2006

(30) Foreign Application Priority Data
Dec. 7, 2004    (TW) ............................ 93137777 A

(51) Int. Cl.
*H01S 3/00* (2006.01)

(52) U.S. Cl. ................................. 372/38.02; 372/38.07
(58) Field of Classification Search .............. 372/38.02, 372/38.07
See application file for complete search history.

(56) References Cited

U.S. PATENT DOCUMENTS

| 4,355,395 | A | * | 10/1982 | Salter et al. | 372/29.012 |
| 5,488,621 | A | * | 1/1996 | Slawson et al. | 372/31 |
| 6,466,595 | B2 | * | 10/2002 | Asano | 372/29.021 |
| 2004/0109482 | A1 | * | 6/2004 | Nakayama | 372/38.02 |

FOREIGN PATENT DOCUMENTS

TW    200419182    10/2004

\* cited by examiner

*Primary Examiner*—Armando Rodriguez
(74) *Attorney, Agent, or Firm*—Birch, Stewart, Kolasch, & Birch, LLP

(57) ABSTRACT

A laser driver. The laser driver comprises a diode driver, a power detector, a first extreme detector, a second extreme detector and a current controller. The diode driver receives bias and modulation currents to control a laser diode for generating light signals. The power detector detects optical power of the light signals. The first and second extreme detectors, both coupled to the power detector, detect the first and second extreme values among detected optical power. The first extreme value is either the maximum or the minimum optical power of the light signals, while the second extreme value is the other.

15 Claims, 7 Drawing Sheets

DUAL LOOP AUTOMATIC POWER CONTROL FOR LASER DRIVER

BACKGROUND

The disclosure relates to a laser driver, and more particularly to a laser driver with automatic laser power control of laser diodes.

Laser diodes have been widely adopted in optical communication due to their high brightness and low dispersion.

Laser diodes are generally driven by a laser driver. A laser driver receives a digital signal to control or vary the current flowing through the laser diode, thus controlling the brightness thereof (i.e. optical output power) and a light emitting signal is then generated. A receiver identifies the digital signal according to the received optical output power. For example, when the optical output power of the laser diode is $P_1$, which is relatively large, it represents a logical high state '1'. When the optical output power of the laser diode is $P_0$, which is relatively small, it represents a logical low state '0'.

The greater the difference between $P_1$ and $P_0$, the better the identification of transmitted data. The quality of the light emitting signal is examined based upon the extinction ratio ($ER=P_1/P_0$). That is, the greater the ER, the better the quality of light emitting signals.

Laser diodes, however, have drawbacks, such as aging effect and temperature effect. That is, when a laser diode is driven with a constant current, the optical output power generated thereby decreases with the increase of operating temperature. Consequently, there is feedback mechanism in the related art to detect the light emitting signal of the laser diode for varying the driving current thereof to fix the average optical output power of the light emitting signal.

Though such feedback mechanism fixes the average optical output power, it, however, fails to solve the impact on ER which is incurred by aging and temperature effects. FIG. 1 shows characteristic curves of the optical power to driving current in a laser diode. With the increase of the operating temperature or aging of components, the optical power-to-driving current characteristic curve may vary from a curve with a greater slope, L1, to a curve with a smaller slope, L2. Assuming the feedback mechanism of the related art fixes the average optical output power of the laser diode, $P_{avg}$, the average driving current hence varies from $I1_{avg}$ to $I2_{avg}$ automatically with the variation of the characteristic curve from L1 to L2. The difference between different driving currents (i.e. the magnitude of modulation current), however, does not vary in response to the increase of temperature or aging of components, that is, $I1_1-I1_0=I2_1-I2_0$. With reference to FIG. 1, the optical output power of light emitting signal varies from $P1_1$ and $P1_0$ to $P2_1$ and $P2_0$ respectively. It can be easily found that with the variation of slopes, ER2 ($=P2_1/P2_0$) is smaller than ER1 ($=P1_1/P1_0$). In other words, if only the average driving current is controlled, the quality of the light emitting signal degrades in response to the increase of temperature or aging of components.

SUMMARY

In view of the above, the invention provides a laser driver. The laser driver comprises a diode driver, a power detector, a first extreme detector, a second extreme detector and a current controller. The diode driver receives bias and modulation currents to control a laser diode for generating light signals. The power detector detects optical power of the light signals. The first and second extreme detectors, both coupled to the power detector, detect the first and second extreme values in the detected optical power. The first extreme value is either the maximum or the minimum optical power of the light signals, while the second extreme value is the other. The current controller comprises a bias current generator and a modulation current generator. The bias current generator generates the bias current according to the first extreme value. The modulation current generator generates the modulation current according to the difference between the first and second extreme values. A first loop constituted by the bias current generator, the diode driver, the laser diode, the power detector and the first extreme detector confines the first extreme value to a first requirement. A second loop constituted by the modulation current generator, the diode driver, the laser diode, the power detector and the first and second extreme detectors confines the difference between the first and second extreme values to a second requirement.

DESCRIPTION OF THE DRAWINGS

The invention is described by way of exemplary embodiments, but not limitations, illustrated in the accompanying drawings in which like references denote similar elements, and in which.

DETAILED DESCRIPTION

Figure 1:
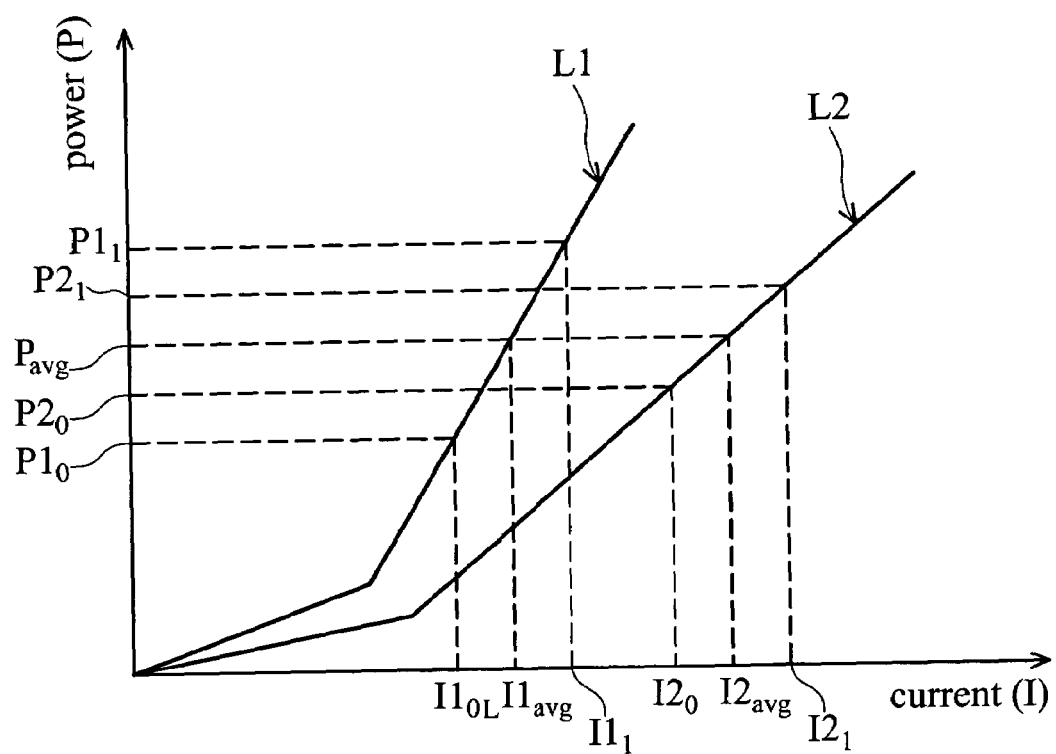
FIG. 1 is a schematic diagram of the optical power to driving current characteristic curves of a laser diode.
Figure 2:
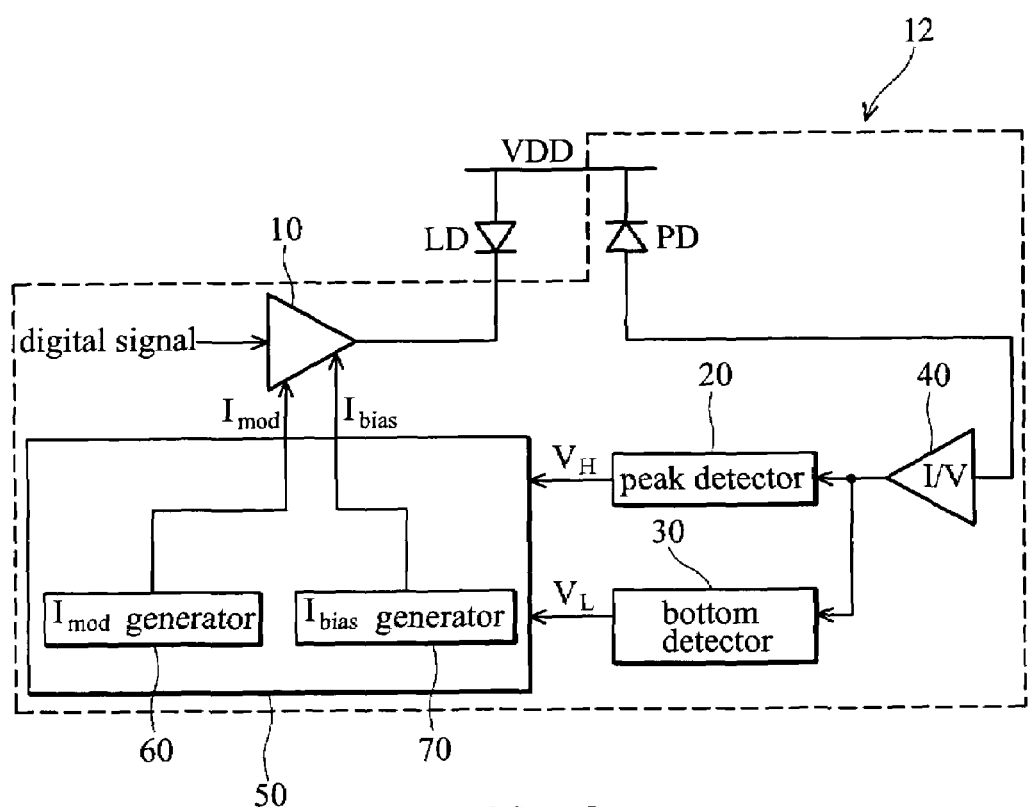
FIG. 2 is a block diagram illustrating a circuit according to an embodiment of the invention.

FIG. 2 shows a block diagram of a circuit according to an embodiment of the invention. A laser driver 12 to drive a laser diode LD comprises a diode driver 10, a photo diode PD, a current-to-voltage converter 40, a peak detector 20, bottom detector 30 and a current controller 50.

The diode driver 10 receives bias current $I_{bias}$ and modulation current $I_{mod}$ to determine the magnitude of driving current $I_1$, when logic state is '1' and $I_2$ when logic state is '0' respectively. The diode driver 10 then generates $I_1$, and $I_0$ in response to the logic state of received digital signal to modulate the optical output power of laser diode LD for generating a light emitting signal.

The photo diode PD disposed in the laser diode LD module converts the optical output power of the laser diode LD to a current. That is the received light emitting signal is converted to a current signal. The current-to-voltage converter 40 then converts the current signal to a voltage signal. Thus, each voltage signal corresponds to the optical output power of the light emitting signal. The photo diode PD and current-to-voltage converter 40 can be seen as a whole as a power detector for detecting the power of the light emitting signal.

The peak detector 20 detects the maximum voltage $V_H$ of the voltage signal during one period, thus obtaining the maximum optical output power of the light emitting signal in that period. Conversely, the bottom detector 30 detects the minimum voltage $V_L$ of the voltage signal during one period, thus obtaining the minimum optical output power of the light emitting signal. It is assumed in the following that the maximum optical output power corresponds to optical power $P_1$, when logic state is "1" and the minimum optical output power corresponds to optical power $P_0$ when the logic state is "0". It is, however, obvious for those skilled in art that if the described relationship changes, there is no effect on the enablement of the invention and thereupon the claim construction would not change.

The current controller 50 comprises $I_{bias}$ generator 70 and $I_{mod}$ generator 60. $I_{bias}$ generator 70 generates current $I_{bias}$ in response to voltage $V_L$, whereas $I_{mod}$ generator 60 generates current $I_{mod}$ in response to voltages $V_L$ and $V_H$.

Two loops in FIG. 2 have partially shared routes. The first loop comprises $I_{bias}$ generator 70, diode driver 10, laser diode LD, photo diode PD, current-to-voltage converter 40 and bottom detector 30. The first loop utilizes a feedback mechanism to clamp $(V_L-V_{thb})$ to a fixed value $N_1$, corresponding to fixing the value of $P_0$, wherein voltage $V_{thb}$ is the reference voltage detected by bottom detector 30 or peak detector 20 when no output is generated by laser diode LD. The second loop comprises $I_{mod}$ generator 60, diode driver 10, laser diode LD, photo diode PD, current-to-voltage converter 40, peak detector 20 and bottom detector 30. The second loop also utilizes a feedback mechanism to clamp $(V_H-V_L)$ to a fixed value $N_2$, corresponding to fixing $(P_1-P_0)$. Thus the following equations are obtained.

$$V_L = R_f \times R \times P_0 + V_{thb} = N_1 + V_{thb} \tag{1}$$

$$V_H = R_f \times R \times P_1 + V_{thb} = N_2 + N_1 + V_{thb} \tag{2}$$

where $R_f$ is the gain of current-to-voltage converter 40 and R is the responsivity of photo diode PD.

From equations (1) and (2), the following equation is derived.

$$\begin{aligned} ER = P_1/P_0 &= (V_H - V_{thb})/(V_L - V_{thb}) \\ &= (V_H - V_L)/(V_L - V_{thb}) + 1 \\ &= N_2/N_1 + 1 = K + 1 \end{aligned} \tag{3}$$

From equation (3) it can be found that with the first and second loops, the extinction ratio ER is fixed and independent of $V_H$, $V_L$ and $V_{thb}$. It does not vary in response to either the aging of components or an increase in operating temperature.

Figure 3:
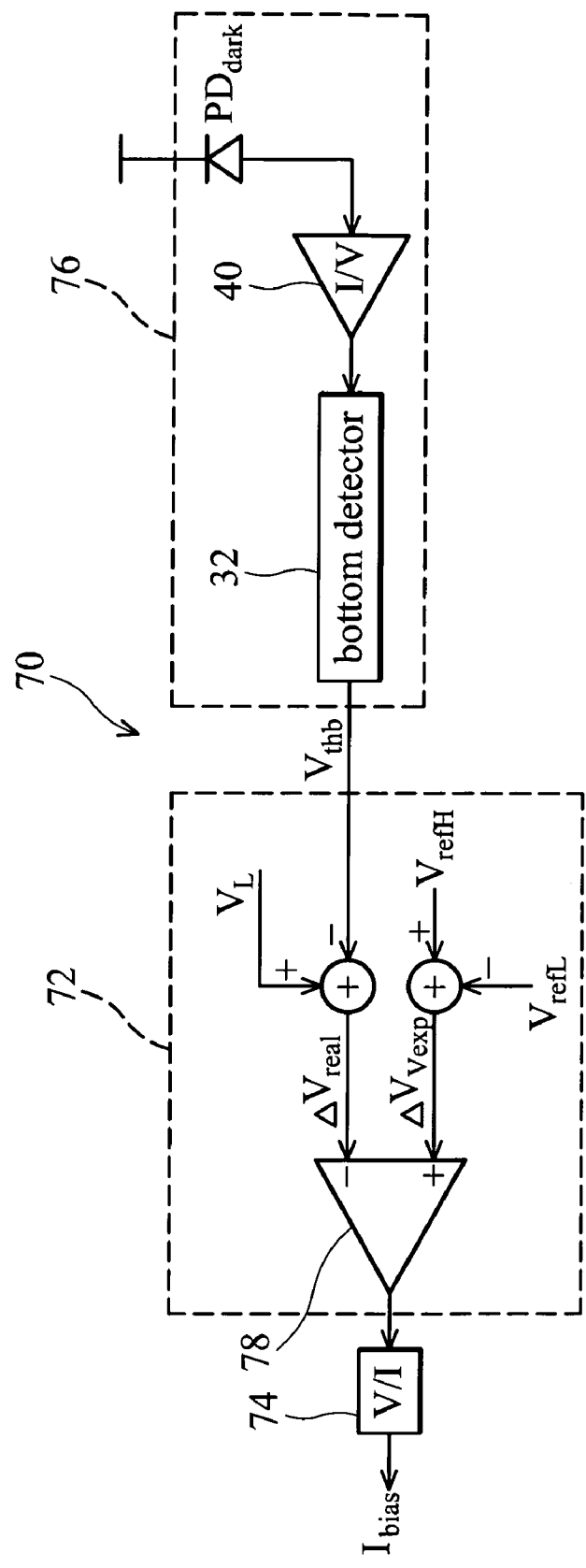
FIG. 3 is a block diagram illustrating a bias current generator.

FIG. 3 is a block diagram of a bias current $I_{bias}$ generator. The $I_{bias}$ generator 70 comprises a reference voltage generator 76, a computation comparison unit 72 and a voltage-to-current converter 74. The reference voltage generator 76 provides the characteristics of photo diode PD as a basis for adjusting voltage $V_L$. For example, as depicted, reference voltage generator 76 generates a corresponding reference voltage $V_{thb}$ when photo diode PD detects no light. It is obvious that voltage $V_{thb}$ is smaller than voltage $V_L$ since voltage $V_{thb}$ is the voltage detected just before laser diode is turned on and voltage $V_L$ is the minimum voltage when laser diode is already turned on. Moreover, it is advantageous that voltage $V_L$ is greater than voltage $V_{thb}$ because the turn on delay of laser diode LD is reduced thereby. The reference voltage generator 76 in FIG. 3 comprises a photo diode $PD_{dark}$ which detects no light, a current-to-voltage converter 40, and a bottom detector 32. The reference voltage $V_{thb}$ can be obtained only by photo diode $PD_{dark}$ and current-to-voltage converter 40. It is, however, more stable with the bottom detector 32 and the disturbance incurred by noise is thus reduced.

The computation comparison unit 72 subtracts $V_{thb}$ from $V_L$ and then has $\Delta V_{real}$. The computation comparison unit 72 also subtracts $V_{refL}$ from $V_{refH}$ and then yields $\Delta V_{exp}$. The comparator 78 then compares $\Delta V_{real}$ and $\Delta V_{exp}$, and the output thereof is desirable only when $\Delta V_{real}$ equals to $\Delta V_{exp}$. The following equation is then derived.

$$V_L = V_{thb} + \Delta V_{exp} = V_{thb} + (V_{refH} - V_{refL}) \tag{4}$$

$V_{refH}$ abd $V_{refL}$ can be seen as two adjustable predetermined voltages. A user can adjust the difference between voltage $V_L$ and reference voltage $V_{thb}$ by setting voltages $V_{refH}$ abd $V_{refL}$.

The voltage-to-current converter 74 converters the output of comparator 78 to a current and then outputs it to the diode driver 10 as a bias current $I_{bias}$.

Figure 4:
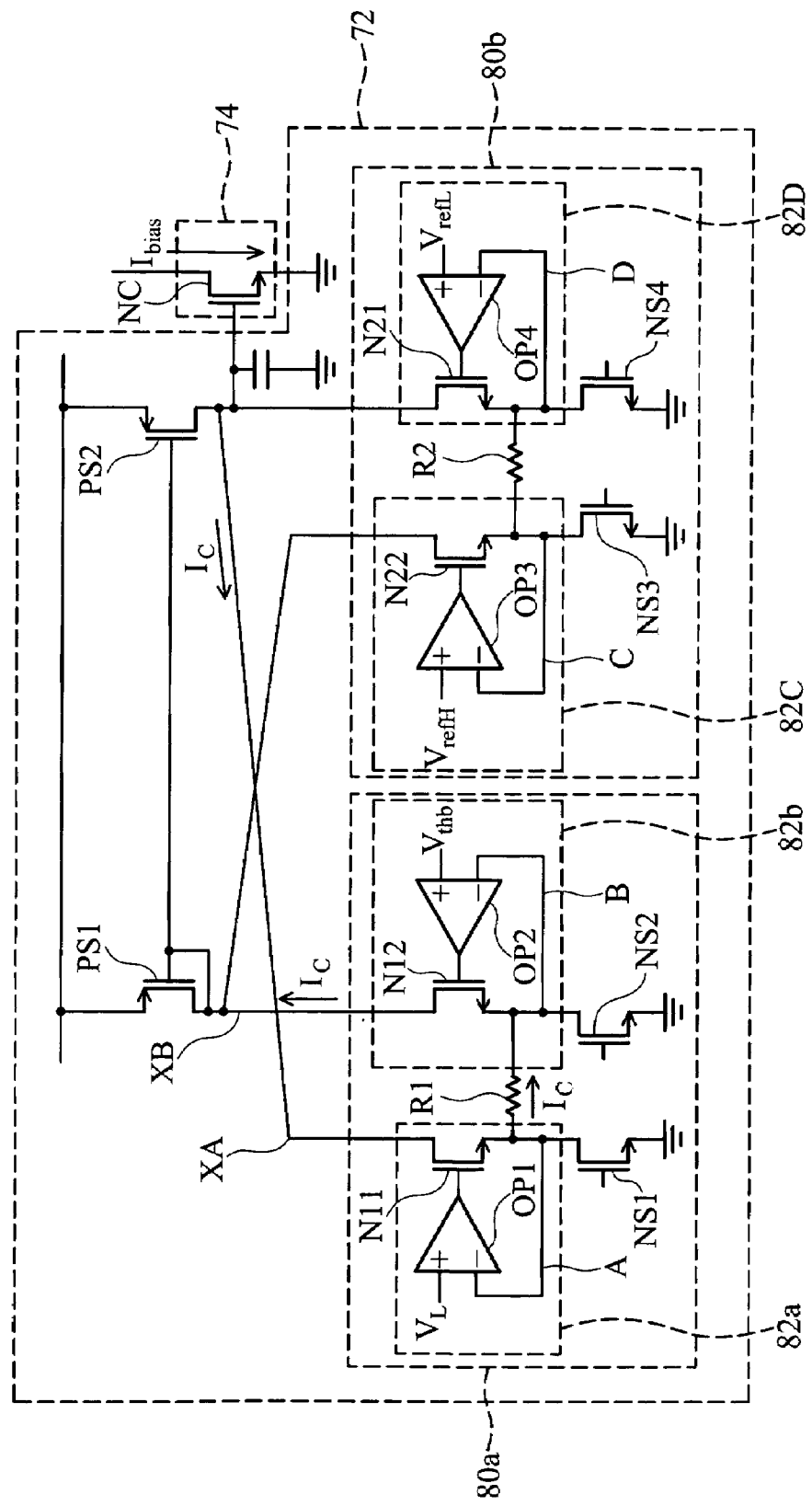
FIG. 4 is a block diagram illustrating an embodiment of a computation comparison unit and a voltage-to-current converter in FIG. 3.

FIG. 4 is an embodiment of computation comparison unit 72 and voltage-to-current converter 74 in FIG. 3.

The PMOS transistors PS1 and PS2 in upper half of FIG. 4 are two mirroring current sources. The lower half of FIG. 4 can be divided into two parts, right half and left half. The left half is voltage-to-current converter 80a converting the difference between $V_L$ and $V_{thb}$ to current $I_c$ and outputting it to voltage-to-current converter 80b in the right half through PMOS transistors PS1 and PS2. The voltage-to-current converter 80b is controlled by voltages $V_{refH}$ and $V_{refL}$ to limit the magnitude of current $I_c$.

Because the circuits of voltage-to-current converters 80a and 80b are the similar and thus only the operation of voltage-to-current converters 80a is described in the following. It should be appreciated for those skilled in the art to contemplate other similar parts under the operating principle introduced below.

The NMOS transistors NS1 and NS2 in voltage-to-current converters 80a can be seen as two current sources providing currents of the same magnitude. Two identical switch modules 82a and 82b are connected to NMOS transistors NS1 and NS2 via nodes A and B respectively. The switch module 82a comprises an operating amplifier OP1 and a NMOS transistor N11. The output of operating amplifier OP1 is connected to the control gate of transistor N11; the negative input terminal thereof is connected to node A and the positive input terminal thereof receives voltage $V_L$. When voltage $V_L$ is smaller than the voltage at node A, transistor N11 is turned off. The node A is then discharged by the current source, PMOS PS2, and thus the voltage of node A is decreased. Conversely, when voltage $V_L$ is greater than the voltage at node A, transistor N11 is turned on. The node A is then charged by the current source, PMOS PS2, and thus the voltage of node A is increased. Hence, the voltage of node A is clamped to $V_L$ when in stable condition, that is, switch module 82a shifts voltage $V_L$ to node A. In the same manner, switch module 82b shifts voltage $V_{thb}$ to node B.

The resistor R1 connected between nodes A and B is used to generate a differential current $I_c(=(V_L-V_{thb})/R1)$. Because of the blocking of current sources NS1 and NS2, the differential current $I_c$ flows into NMOS transistor N11 from node XA and then flows out from node XB via NMOS transistor N12 as shown.

In a similar way, the voltage-to-current converter 80b generates a current with a value equal to $(V_{refH}-V_{refL})/R2$ through resistor R2. When the magnitude of differential current $I_c$ is not equal to $(V_{refH}-V_{refL})/R2$, nodes XA or XB will be charged or discharged and thus the voltage at nodes XA and XB changes. The current $I_{bias}$ is then changed by voltage-to-current converter 74 (taking the NMOS transistor NC in FIG. 4 as an example). By the described first loop, the variation of current $I_{bias}$ changes the voltage $V_L$ which in turn changes differential current $I_c$. The variation of differential current $I_c$ then changes current $I_{bias}$. By such a feedback mechanism, $I_c$ will equal $(V_{refH}-V_{refL})/R2$ when in stable condition and the following equation is derived.

$$I_c=(V_L-V_{thb})/R1=(V_{refH}-V_{refL})/R2$$

$$V_L=V_{thb}+(V_{refH}-V_{refL})*R1/R2 \quad (5)$$

Voltages $V_{thb}$, $V_{refH}$ and $V_{refL}$ and resistors R1 and R1 are fixed, so voltage $V_L$ is confined to a constant by the first loop. Equation (5) can be simplified into equation (4) by equaling of R1 and R2.

Figure 5:
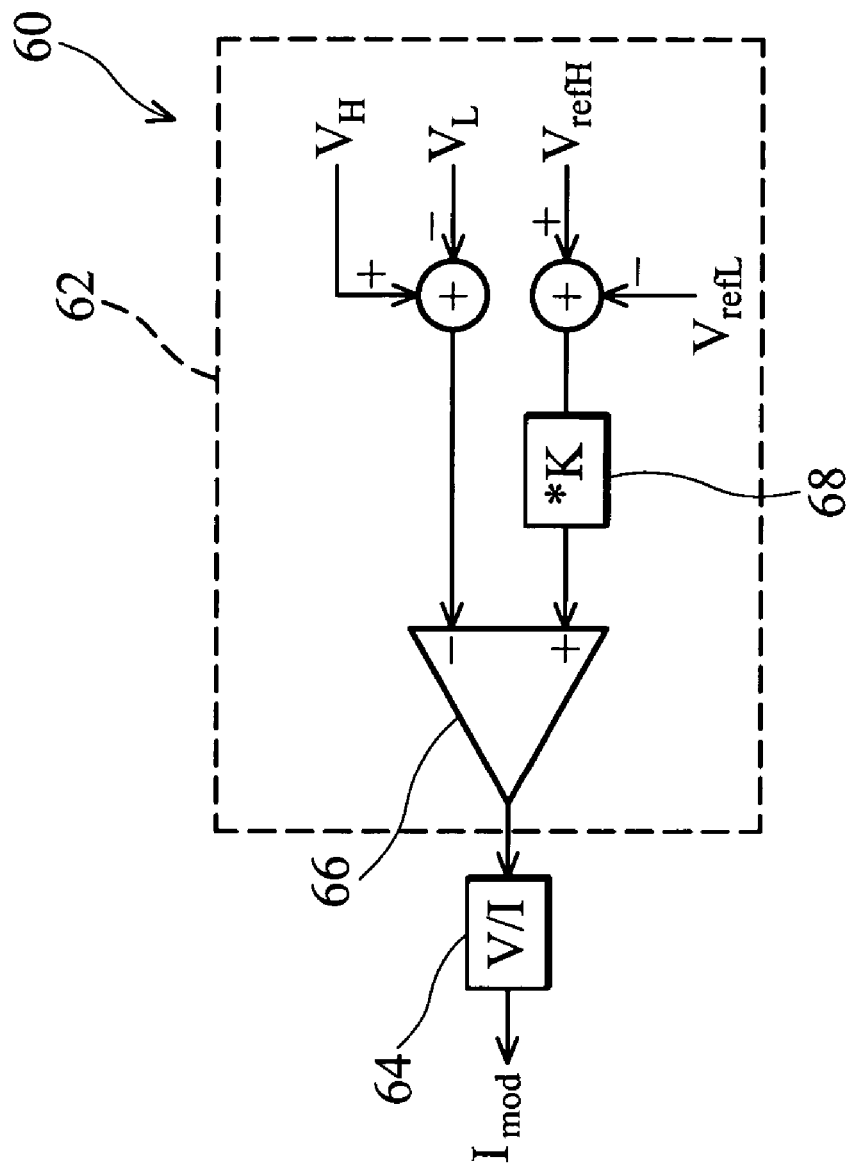
FIG. 5 is a block diagram illustrating an embodiment of a modulation current generator.

Refer to FIG. 5, a block diagram of $I_{mod}$ generator. With reference to FIG. 3, the computation comparison unit 62 and voltage-to-current converter 64 in FIG. 5 are similar to computation comparison unit 72 and voltage-to-current converter 74 in FIG. 3 except that some input signals are different and there is a multiplier 68 at the positive input terminal of comparator 66 in computation comparison unit 62 to multiply the difference between $V_{refH}$ and $V_{refL}$ by K. According to the operating description of FIG. 3, computation comparison unit 62 implements the following equation when the output of comparator 66 is desirable.

$$V_H-V_L=K*(V_{refH}-V_{refL}) \quad (6)$$

Figure 6:
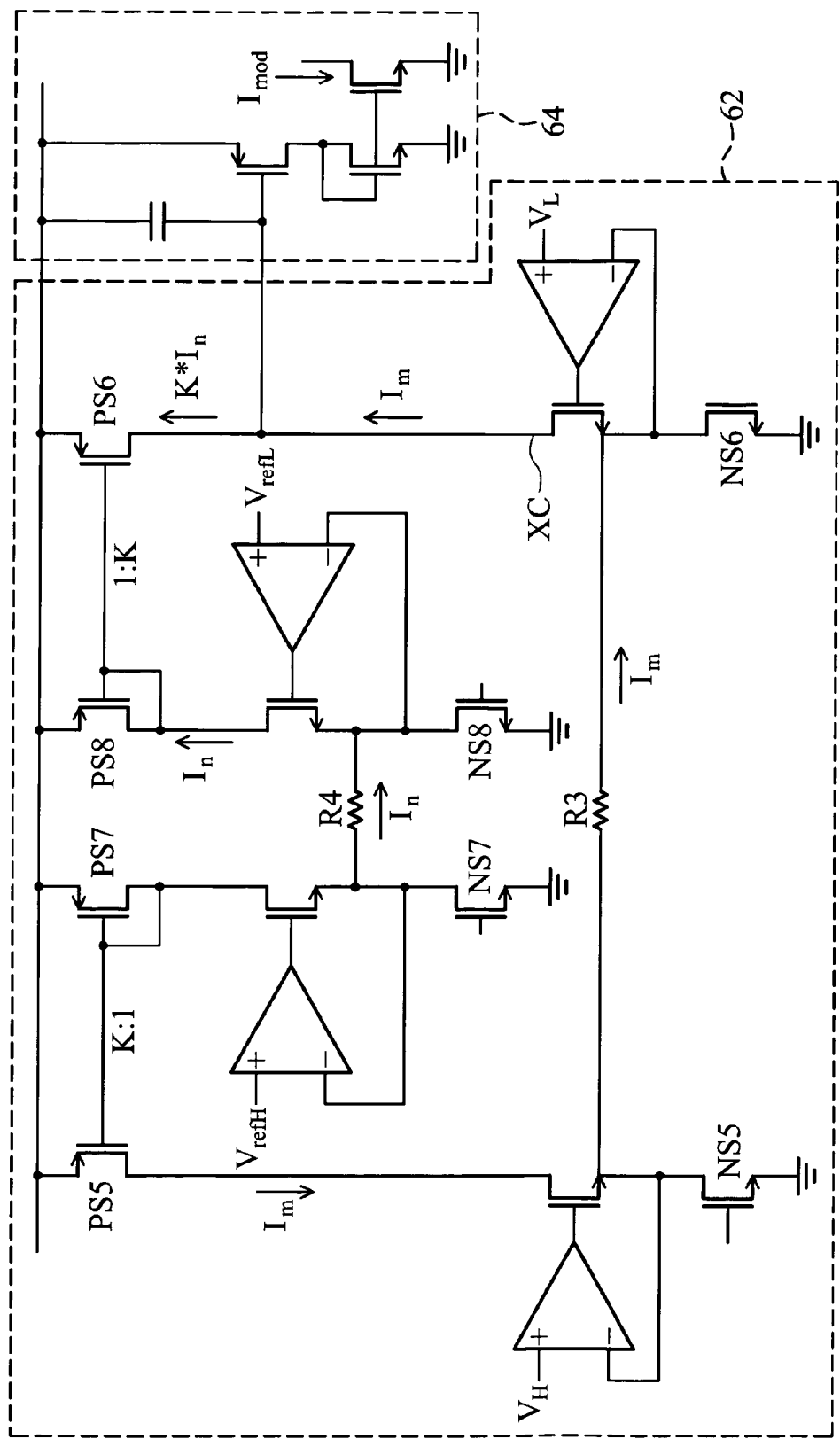
FIG. 6 is a block diagram illustrating an embodiment of a computation comparison unit and a voltage-to-current converter in FIG. 5.

FIG. 6 is an embodiment of computation comparison unit 62 and voltage-to-current converter 64 in FIG. 5. Because FIG. 6 is similar to FIG. 4, only some main points are introduced in the following. Those skilled in the art should understand the operating of FIG. 6 in accordance with the description of FIG. 4 and the discussion below. Current source NMOS NS5 corresponds to current source NMOS NS6 and current source NMOS NS7 corresponds to current source NMOS NS8. The current provided by NMOS transistor NS5 however is K times the current provided by NMOS transistor NS7. This is generally achieved by varying the component size according to the desired ratio. PMOS transistors PS5 and PS7 constitute a current mirror and the current flowing through transistor PS5 is K times that flowing through transistor PS7 for the K time component size. Similarly, the current flowing through transistor PS6 is K times that flowing through transistor PS8.

Current $I_m$ flowing through resistor R3 is $(V_H-V_L)/R3$ and is diverted to node XC for the blocking of current source NMOS NS6. Current $I_n$ flowing through R4 is $(V_{refH}-V_{refL})/R4$ and flows through PMOS transistor PS8. A current which is K times the current $I_n$, is then mirrored by PMOS transistor PS6 and flows out of node XC. Whenever current $I_m$ is not equal to $I_n*K$, nodes XC will be charged or discharged and thus the voltage at nodes XC is changed. The current $I_{mod}$ is then changed by voltage-to-current converter 64 in FIG. 6. With the second loop discussed above, the variation of current $I_{mod}$ changes the difference between voltages $V_L$ and $V_H$, which in turn changes the current $I_m$. The variation of current $I_m$ then changes current $I_{mod}$. With such feedback mechanism, current $I_m$ will equal $I_n*K$ when in stable condition and the following equation is derived.

$$(V_H-V_L)/R3=K*(V_{refH}-V_{refL})/R4$$

$$V_H-V_L=K*(V_{refH}-V_{refL})*R3/R4 \quad (7)$$

Voltages $V_{thb}$, $V_{refH}$ and $V_{refL}$ and resistors R3 and R4 are fixed, so the second loop confines $(V_H-V_L)$ to a constant. Equation (7) can be simplified into equation (6) by equaling R3 and R4.

Figure 7:
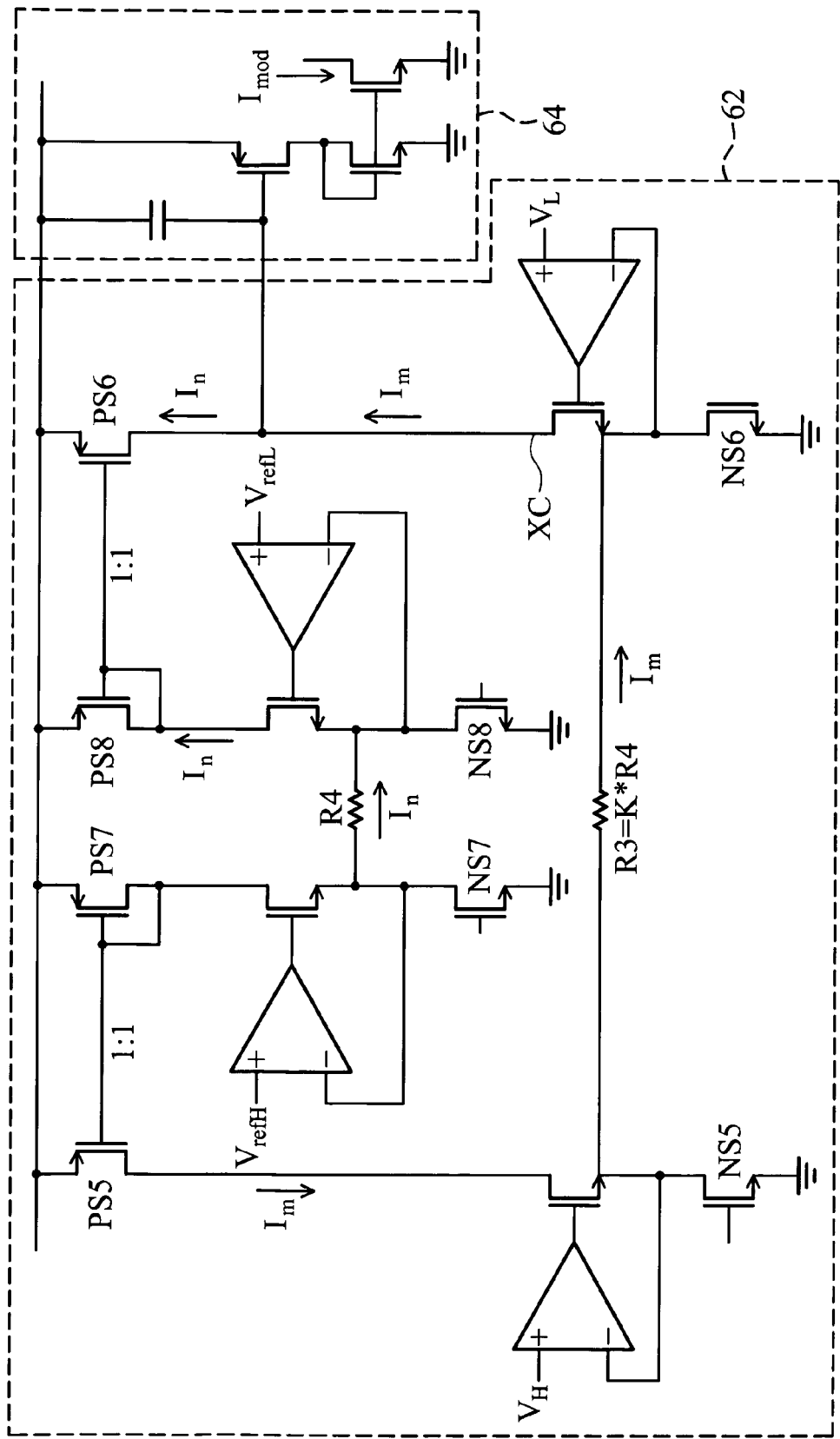
FIG. 7 is a block diagram illustrating another embodiment of a computation comparison unit and a voltage-to-current converter in FIG. 5.

FIG. 7 is another embodiment of computation comparison unit 62 and voltage-to-current converter 64 in FIG. 5. FIG. 7 is similar to FIG. 6 except that the magnitude of currents provided by NMOS transistor NS5~NS8 is the same, the size of PMOS transistors PS5~PS8 is the same and the resistance of resistor R3 is K times that of resistor R4. In stable condition, the following equation is derived in FIG. 7 by this feedback mechanism.

$$V_H-V_L=(V_{refH}-V_{refL})R3/R4=K*(V_{refH}-V_{refL})$$

So $(V_H-V_L)$ is also limited to a constant which is K times $(V_{refH}-V_{refL})$.

From the foregoing discussion, an embodiment of laser driver according to the invention comprises two loops. One loop locks voltage $V_L$, corresponding to lock of $P_0$, and the other locks voltage $(V_H-V_L)$, corresponding to lock of $(P_1-P_0)$. Consequently, utilizing embodiments of the invention, the extinction ratio ER(=$P_1/P_0$) regarding the quality of the light emitting signal is confined to a constant and thus would not vary with aging of components or increase of operating temperature.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A laser driver to drive a laser diode comprising:
   a diode driver receiving bias and modulation currents to control the laser diode for generating light signals;
   a power detector detecting the power of the light signals;
   a first extreme detector, coupled to the power detector, detecting a first extreme value of detected power;
   a second extreme detector, coupled to the power detector, detecting a second extreme value of detected power, wherein the first extreme value is either the maximum or minimum power of the light signals while the second extreme value is the other; and
   a current controller comprising:
   a bias current generator generating the bias current according to the first extreme value; and
   a modulation current generator generating the modulation current according to the difference between the first and second extreme values;
   wherein a first loop constituted by the bias current generator, diode driver, laser diode, power detector and first extreme detector confines the first extreme value to a first requirement and a second loop constituted by the modulation current generator, diode driver, laser diode, power detector, first extreme detector and second extreme detector confines the difference between the first and second extreme values to a second requirement.

2. The laser driver of claim 1, wherein the power detector comprises:
  a photo diode detecting the optical power of the laser diode and converting a detected optical power to generate an optical current; and
  a current-to-voltage converter converting the optical current to a detecting voltage.

3. The laser driver of claim 1, wherein the first and second extreme detectors are a peak detector and a bottom detector.

4. The laser driver of claim 1, wherein the bias current generator comprises a reference voltage generator to generate a reference voltage in accordance with a predetermined condition of the laser diode; the first extreme value is a first voltage and the first loop confines the difference between the first voltage and the reference voltage to a predetermined value.

5. The laser driver of claim 4, wherein the bias current generator comprises:
  a photo diode being irradiated by light with a constant and predetermined power to generate a constant optical current; and
  a current-to-voltage converter converting the constant optical current to the reference voltage.

6. The laser driver of claim 4, wherein bias current generator further comprises:
  a first voltage-to-current converter converting the difference between the first voltage and the reference voltage to a differential current and outputting the differential current from a output terminal;
  a second voltage-to-current converter, being controlled by a predetermined voltage, limiting the differential current to a constant value; and
  a voltage-to-current converter, coupled to the output terminal, converting the voltage of the output terminal to the bias current.

7. The laser driver of claim 6, wherein the first voltage-to-current converter comprises:
  a constant current source pair, providing currents of the same magnitude;
  a switch module pair, coupled to the constant current source pair respectively, each switch module receiving an input voltage and comprising a switch, coupled to the corresponding constant current source via a reference node, wherein the switch in each switch module is switched off when the input voltage is lower than the voltage at the reference node; and
  a coupling resistor, coupled between the two reference nodes of the switch module pair;
  wherein the two input voltages of the first voltage-to-current converter are the first and reference voltages.

8. The laser driver of claim 7, wherein each switch module further comprises an operational amplifier comprising:
  a positive input terminal receiving the input voltage;
  a negative input terminal coupled to a corresponding reference node; and
  an output terminal controlling a corresponding switch.

9. The laser driver of claim 6, wherein each voltage-to-current converter comprises:
  a constant current source pair, providing currents of the same magnitude;
  a switch module pair, coupled to the constant current source pair respectively, each switch module receiving an input voltage and comprising a switch, coupled to the corresponding constant current source via a reference node, wherein the switch in each switch module is switched off when the input voltage is lower than the voltage at the reference node; and
  a coupling resistor, coupled between the two reference nodes of the switch module pair;
  wherein the two input voltages of the first voltage-to-current converter are the first voltage and reference voltage and the two input voltages of the second voltage-to-current converter are first and second predetermined voltages.

10. The laser driver of claim 4, wherein the second loop confines the difference between the first and second extreme values to a predetermined multiple of the predetermined value.

11. The laser driver of claim 10, wherein the modulation current generator comprises:
  a first voltage-to-current converter including an input terminal and converting the difference between the first voltage and the reference voltage to a differential current;
  a second voltage-to-current converter, controlled by a predetermined voltage, limiting the differential current to the predetermined multiple of the predetermined value; and
  a voltage-to-current converter, coupled to the first voltage-to-current converter, converting the voltage at the output terminal thereof to the modulation current.

12. The laser driver of claim 11, wherein the first voltage-to-current converter comprises:
  a constant current source pair, providing currents of the same magnitude;
  a switch module pair, coupled to the constant current source pair respectively, each switch module receiving an input voltage and comprising a switch coupled to the corresponding constant current source via a reference node, wherein the switch in each switch module is switched off when the input voltage is lower than the voltage at the reference node; and
  a coupling resistor, coupled between the two reference nodes of the switch module pair;
  wherein the two input voltages of the first voltage-to-current converter are the first voltage and reference voltages.

13. The laser driver of claim 12, wherein each switch module further comprises an operational amplifier comprising:
  a positive input terminal receiving the input voltage;
  a negative input terminal coupled to a corresponding reference node; and
  an output terminal controlling a corresponding switch.

14. The laser driver of claim 11, wherein each voltage-to-current converter comprises:
  a constant current source pair, providing currents of the same magnitude;
  a switch module pair, coupled to the constant current source pair respectively, each switch module receiving an input voltage and comprising a switch coupled to the corresponding constant current source via a reference node, wherein the switch in each switch module is switched off when the input voltage is lower than the voltage at the reference node; and
  a coupling resistor, coupled between the two reference nodes of the switch module pair;
  wherein the two input voltages of the first voltage-to-current converter are the first voltage and reference voltage, the two input voltages of the second voltage-to-current converter are first and second predetermined voltages and the current generated by each constant current source of the first voltage-to-current converter is the predetermined multiple of current generated by each constant current source of the second voltage-to-current converter.

15. The laser driver of claim 11, wherein each voltage-to-current converter comprises:
- a constant current source pair, providing currents of the same magnitude;
- a switch module pair, coupled to the constant current source pair respectively, each switch module receiving an input voltage and comprising a switch coupled to the corresponding constant current source via a reference node, wherein the switch in each switch module is switched off when the input voltage is lower than the voltage at the reference node; and
- a coupling resistor, coupled between the two reference nodes of the switch module pair;

wherein the two input voltages of the first voltage-to-current converter are the first voltage and reference voltage, the two input voltages of the second voltage-to-current converter are first and second predetermined voltages and the resistance of the coupling resistor of the first voltage-to-current converter is the predetermined multiple of the resistance of the coupling resistor of the second voltage-to-current converter.

* * * * *